United States Patent [19]
Hayashi et al.

[11] Patent Number: 5,493,218
[45] Date of Patent: Feb. 20, 1996

[54] MAGNETIC DETECTING APPARATUS WITH A VARIABLE VOLTAGE POWER SUPPLY

[75] Inventors: Yoshinori Hayashi; Masayoshi Yamashita; Makoto Hosokawa; Nanayuki Takeuchi; Akira Miki, all of Hamamatsu, Japan

[73] Assignee: Yamaha Corporation, Japan

[21] Appl. No.: 79,346

[22] Filed: Jun. 18, 1993

[30]   Foreign Application Priority Data

Jun. 19, 1992  [JP]  Japan ................... 4-42466 U

[51] Int. Cl.$^6$ ............... G01R 33/06; G01P 3/44; H02J 9/00; G01B 7/00
[52] U.S. Cl. .............. 324/207.21; 307/64; 324/174; 324/207.25; 324/252; 327/510
[58] Field of Search ................... 324/173, 174, 324/207.13, 207.19, 207.2, 207.21, 207.25, 235, 251, 252, 117 R, 117 H; 307/64–66; 327/510, 511, 516

[56]   References Cited

U.S. PATENT DOCUMENTS

| | | | |
|---|---|---|---|
| 2,995,702 | 8/1961 | Lyon | 324/251 |
| 4,404,523 | 9/1983 | Hughes et al. | 324/207.13 |
| 4,464,625 | 8/1984 | Lienhard et al. | 324/252 X |
| 4,920,549 | 4/1990 | Dinovo | 324/251 U X |
| 5,241,270 | 8/1993 | Ng | 324/251 |
| 5,280,455 | 1/1994 | Kanaishi | 307/64 X |

FOREIGN PATENT DOCUMENTS 0275601  12/1986  Japan ................ 324/207.19

*Primary Examiner*—Gerard R. Strecker
*Attorney, Agent, or Firm*—Ostrolenk, Faber, Gerb & Soffen

[57]   ABSTRACT

A magnetic detecting apparatus including a magnetic sensor for detecting the displacement of a member which is detected by a variation in the voltage, a sampler for sampling the voltage detected by the magnetic sensor at the required period, and a voltage power supplier for supplying the required power supply voltage to the magnetic sensor only while the sampler samples the voltage.

1 Claim, 3 Drawing Sheets

5,493,218

MAGNETIC DETECTING APPARATUS WITH A VARIABLE VOLTAGE POWER SUPPLY

BACKGROUND OF THE INVENTION

1. Field of the Invention

The present invention relates to magnetic detecting apparatuses, and more particularly, to a magnetic detecting apparatus for detecting by a magnetic method the positions of magnetic poles and a rotation velocity of a rotor of a motor and the like.

2. Background Art

Magnetic detecting apparatuses are conventionally known. An example of a conventional magnetic detecting apparatus is shown in the circuit diagram of FIG. 4. In the illustrated circuit, magnetic sensors 1–4 are provided, which consist respectively of a magneto-resistance element, i.e., a thin film device having an electrical resistance that varies in response to a magnetic field that is applied across it, also called a MR sensor. One terminal of each magnetic sensor 1 and 2, to which a power supply voltage $V_{cc}$ is applied, is connected together. The other terminal of the magnetic sensor 1 and 2 is connected to one terminal of each magnetic sensor 3 and 4, respectively. The other terminal of each magnetic sensor 3 and 4 is respectively grounded to the earth. The magnetic sensors 1–4 together form a circuit connected by a bridge. One input terminal of a differential amplifier 5 is connected to a terminal $P_a$, namely, the connecting point to which the other terminal of the magnetic sensor 1 and one terminal of the magnetic sensor 4 is connected together. The other input terminal of the differential amplifier 5 is connected to a terminal $P_b$, namely, the connecting point to which the other terminal of the magnetic sensor 2 and one terminal of the magnetic sensor 3 are connected to each other. The differential amplifier 5 detects the voltage between the terminals $P_a$ and $P_b$, An output voltage of the differential amplifier 5 is outputted via an output terminal 6, such as in the case wherein, the detected voltage $V_0$ indicates-the positions of the magnetic poles of a rotor of a motor whereat the magnetic sensors 1–4 are fixed, as shown in FIG. 5.

In the conventional magnetic detecting apparatus, even if the detected voltage $V_0$ is not used as data, a current is always conducted through the magnetic sensors 1–4. Therefore, in the case where the detected voltage $V_0$ is stored as backup data (i.e. background data), it is necessary to use only, as the magnetic sensors 1–4, a magneto-resistance element which uses a low amount of electricity and has a high resistance. Accordingly, in the case where normal magneto-resistance elements or Hall elements are used as the magnetic sensors 1–4, when using a battery, it is difficult to store data as the backup data.

SUMMARY OF THE INVENTION

In consideration of the above, it is an object of the present invention to provide a magnetic detecting apparatus which is able to economize on the use of electricity even if a normal magnetic sensor is used.

To satisfy this object, the present invention provides a magnetic detecting apparatus comprising a magnetic sensor for detecting the displacement of a member and outputting a voltage that varies according to the displacement of the member, a sampler for sampling the voltage detected by the magnetic sensor at the required period, and a voltage power supply for supplying the required voltage to the magnetic sensor only while the sampler samples the voltage.

Furthermore, the present invention provides a magnetic detecting apparatus comprising a magnetic sensor for detecting the displacement of a member and outputting a voltage that varies according to the displacement of the member, and a voltage power supply for supplying a first power supply voltage to the magnetic sensor under a normal state of operation, and supplying a second power supply voltage lower than the first power supply voltage to the magnetic sensor while storing the voltage as backup data.

According to this construction, even if a normal magnetic sensor is used, it is possible to economize on the use of electricity in comparison to the case where the current is always conducted through the magnetic sensors by a power supply having the required voltage.

DETAILED DESCRIPTION OF THE PREFERRED EMBODIMENTS

Figure 1:
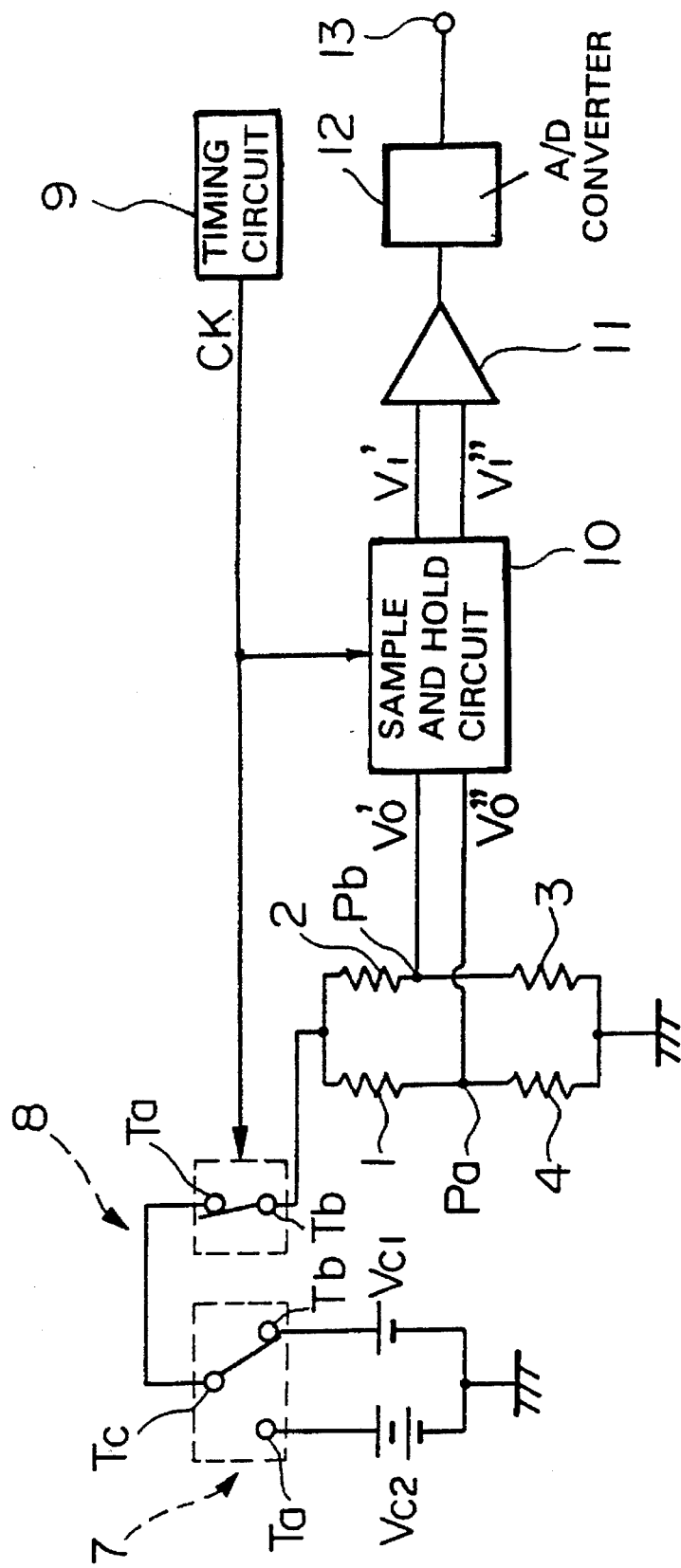
FIG. 1 is a circuit diagram showing the layout of a magnetic detecting apparatus according to a preferred embodiment of the present invention.
Figure 4:
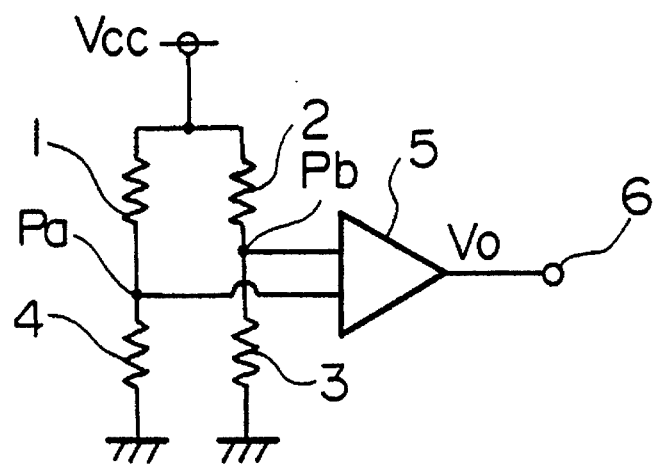
FIG. 4 is a circuit diagram showing the layout of a conventional magnetic detecting apparatus.
Figure 5:
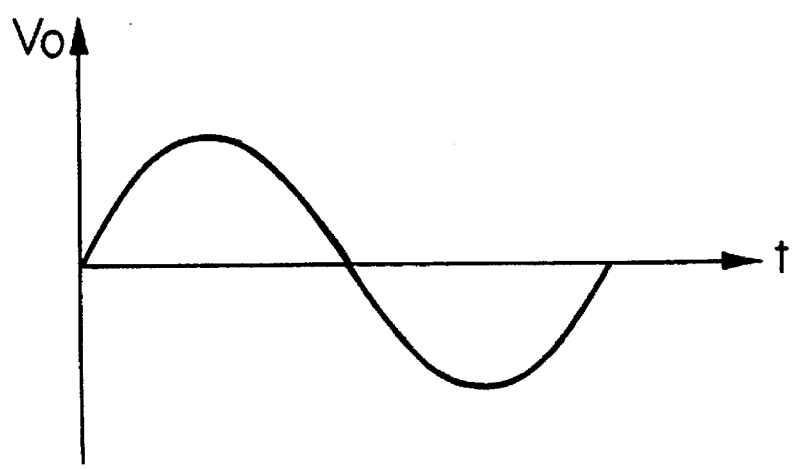
FIG. 5 shows an example of the waveform of the detected voltage $V_0$ outputted from a magnetic detecting apparatus shown in FIG. 4.

Hereinafter, an explanation of the preferred embodiments of the present invention is given with reference to the figures. FIG. 1 is a circuit diagram showing the layout of a magnetic detecting apparatus according to a preferred embodiment of the present invention. In FIG. 1, components which correspond to components in the conventional magnetic detecting apparatus shown in FIG. 4, will retain the original identifying numeral, and their description will not herein be repeated. In FIG. 1, MOS (metal oxide semiconductor) type switches 7 and 8 are provided. A power supply voltage $V_{c2}$ is applied to a terminal $T_a$ of the switch 7, and a power supply voltage $V_{c1}$ ($V_{c2} > V_{c1}$, $V_{c1}$ an be 0V) is applied to a terminal $T_b$ of the switch 7. A common terminal $T_c$ of the switch 7 is connected to a terminal $T_a$ of the switch 8. A terminal $T_b$ of the switch 8 is connected to one terminal of each of the magnetic sensors 1 and 2, which are, in turn, connected to each other. The common terminal $T_c$ of the switch 7 is connected to the terminal $T_a$ during the normal state of operation of the apparatus, and is connected to the terminal $T_b$ during the standby mode of the apparatus.

Figure 2:
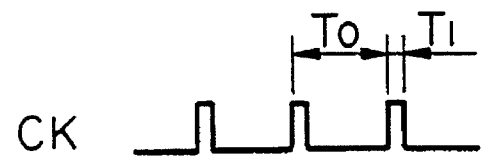
FIG. 2 shows an example of the waveform of a clock CK outputted from a clock generating circuit 9.

A timing circuit 9 generates a clock CK with a pulse width $T_1$ at a period $T_0$ as shown in FIG. 2. When the value of the clock CK is high, the switch 8 is turned on so that the current is conducted through the magnetic sensors 1–4, and when the value of the clock CK is low, the switch 8 is turned off. A sample and hold circuit 10, samples and holds the detected voltage $V'_0$ and $V''_0$ outputted from the bridge-connected circuit, comprising the magnetic sensors 1–4, while synchronizing with the clock CK, and then delivers the output voltage $V'_1$ and $V''_1$. A low-power type differential amplifier 11 differentially amplifies the output voltage $V'_1$ and $V''_1$ from the sample and hold circuit 10. An A/D converter 12 converts the output voltage from the differential amplifier 11 into digital data and delivers it via an output terminal 13.

Through the above-described construction, for example, in the case of detecting the positions of the magnetic poles of the rotor of the motor, the magnetic sensors 1–4 are fixed to the motor, and the common terminal $T_c$ of the switch 7 is connected to the terminal $T_a$. Furthermore, the switch 8 is turned on or off in response to the clock CK at the period $T_0$, which has the waveform shown in FIG. 2, thereby the power supply voltage $V_{c2}$ is applied across the connecting point of one terminal of the magnetic sensor 1 and one terminal of the magnetic sensor 2 and the earth. Accordingly, the required current is conducted through the magnetic sensors 1–4 at the period $T_0$.

Next, when the motor is rotated, and thereby a magnetic field acts on the surface of the motor, on which surface the magnetic sensors 1–4 are fixed, the detected voltage $V'_0$ (see FIG. 3(a)) and $V''_0$ (not shown) which vary in response to the angle $\theta$ formed by the current and the magnetization, which is the intensity of detectable direction component of the magnetic field, namely, the direction of the magnetic field, are outputted from the bridge-connected circuit comprising the magnetic sensors 1–4.

Figure 3:
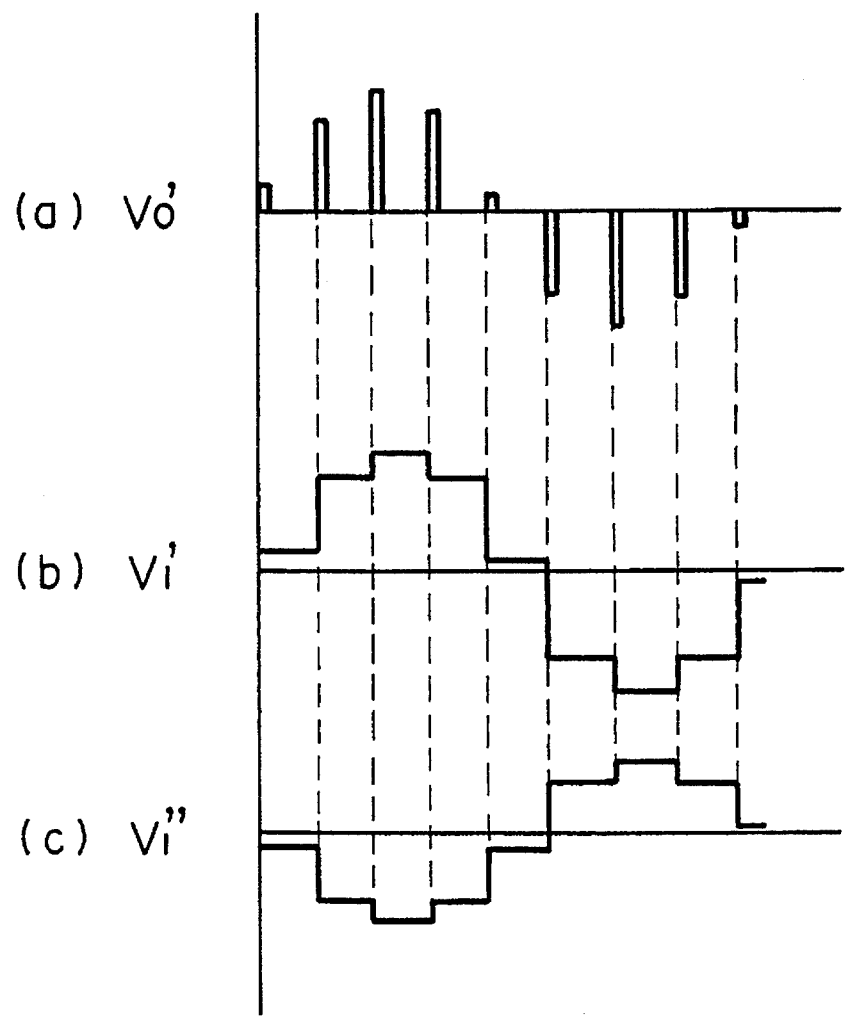
FIG. 3 shows an example of the waveforms of signals outputted from each part of a magnetic detecting apparatus as shown in FIG. 1.

Accordingly, since the sample and hold circuit 10 samples and holds the detected voltage $V'_0$ and $V''_0$ outputted from the bridge-connected circuit, comprising the magnetic sensors 1–4, while synchronizing with the clock CK, and delivers output voltage $V'_1$ and $V''_1$ (see FIG. 3 (b) and (c)), the differential amplifier 11 differentially amplifies the output voltage $V'_1$ and $V''_1$ from the sample and hold circuit 10. Next, the A/D converter 12 converts the output voltage from the differential amplifier 11 into digital data and delivers it via the output terminal 13.

Consequently, because the conducting time of the magnetic sensors 1–4 is equal to the pulse width $T_1$ of the clock CK and the conducting period of the magnetic sensors 1–4 is equal to the period $T_0$ of the clock CK, the amount of electricity used in the normal state of operation described above, decreases at the rate of $(T_1/T_0)*100$ (%) in contrast to the continuous conduction of the conventional magnetic detecting apparatus.

In contrast, in the case of storing the detected data outputted from the A/D converter 12, the common terminal $T_c$ of the switch 7 is connected to the terminal $T_b$. Accordingly, because the power supply voltage supplied to the magnetic sensors 1–4 is changed from the power supply voltage $V_{c2}$, during the normal state of operation, to the power supply voltage $V_{c1}$, the amount of electricity used during the standby mode decreases at the rate of $(V_{c1}/V_{c2})*100$ (%). In this case, since the detect voltage decreases from the voltage $V'_0$ to the voltage $(V_{c1}/V_{c2})*V'_0$ in response to the decrease of the power supply voltage, it is possible to increase the gain of the differential amplifier 11 so that the value corresponds to the decrease in the detected voltage.

As described above, it is possible to economize on the amount of electricity used in response to the duty ratio of the current conducted, since the current is conducted through the magnetic sensors 1–4, only while the detected voltage $V'_0$ and $V''_0$ outputted from the bridge-connected circuit comprising the magnetic sensors 1–4, are sampled. Moreover, during the standby mode, it is possible to further economize on the amount of electricity used, even more than in the normal state of operation, because the power supply voltage is decreased.

Furthermore, in the above-mentioned embodiment, the example is given in which, magneto-resistance elements are used as the magnetic sensors 1–4; however, the present invention is not limited thereto. It is also possible to use Hall elements as the magnetic sensors 1–4.

What is claimed is:

1. A magnetic detecting apparatus having a displacement data detecting mode and a background data detecting and storing mode, the apparatus comprising:

a magnetic sensor for detecting displacement of a member during the displacement data detecting mode, and outputting an output voltage that varies in response to said displacement of the member, and for detecting background data during said background data detecting and storing mode, and voltage power supplying means for periodically supplying a first power supply voltage to said magnetic sensor during the displacement data detecting mode, and periodically supplying a second power supply voltage lower than said first power supply voltage to said magnetic sensor during the background data detecting and storing mode.

* * * * *